United States Patent [19]
Clasen

[11] Patent Number: 4,839,534
[45] Date of Patent: Jun. 13, 1989

[54] METHOD AND APPARATUS FOR ESTABLISHING A SYSTEM CLOCK IN RESPONSE TO THE LEVEL OF ONE OF TWO CLOCK SIGNAL SOURCES

[75] Inventor: Peter-Michael Clasen, Munich, Fed. Rep. of Germany

[73] Assignee: Siemens Aktiengesellschaft, Berlin and Munich, Fed. Rep. of Germany

[21] Appl. No.: 109,840

[22] Filed: Oct. 16, 1987

[30] Foreign Application Priority Data

Oct. 16, 1986 [DE] Fed. Rep. of Germany ....... 3635294

[51] Int. Cl.$^4$ .................... H03K 5/13; H03L 7/00
[52] U.S. Cl. ...................... 307/269; 328/63; 328/72
[58] Field of Search ............ 307/269, 350, 480, 351, 307/360; 328/72, 63; 377/78, 54, 104

[56] References Cited

U.S. PATENT DOCUMENTS

| | | | |
|---|---|---|---|
| 3,609,391 | 9/1971 | Hatano et al. | 307/480 |
| 4,524,291 | 6/1985 | Lehning | 307/360 |
| 4,528,591 | 7/1985 | Liepe et al. | 307/360 |
| 4,529,892 | 7/1985 | Reilly et al. | 307/360 |
| 4,571,547 | 2/1986 | Day | 307/360 |

OTHER PUBLICATIONS

Siemens LWL-Komponenten, Wandler, Sender und Empfanger, MeBzubenhor, pp. 92-95, date unknown.

*Primary Examiner*—Stanley D. Miller
*Assistant Examiner*—Richard Roseen
*Attorney, Agent, or Firm*—Hill, Van Santen, Steadman & Simpson

[57] ABSTRACT

A system clock is produced either from clock signals (t1) recovered in a clock regenerator, based on surface wave filtered technology and having level fluctuations, or from the digital clock signals (t2) internally generated in, for example, an access controller of a ring network, in response to the level of the regenerated clock signals (t1). The change in the source of the system clock is accomplished after an early detection of the level fluctuations, so that the clock signal (t1,t2) currently connected to the clock line are disconnected and, after a short delay time, the other clock signal (t1,t2) is sychronously switched to the clock line.

5 Claims, 1 Drawing Sheet

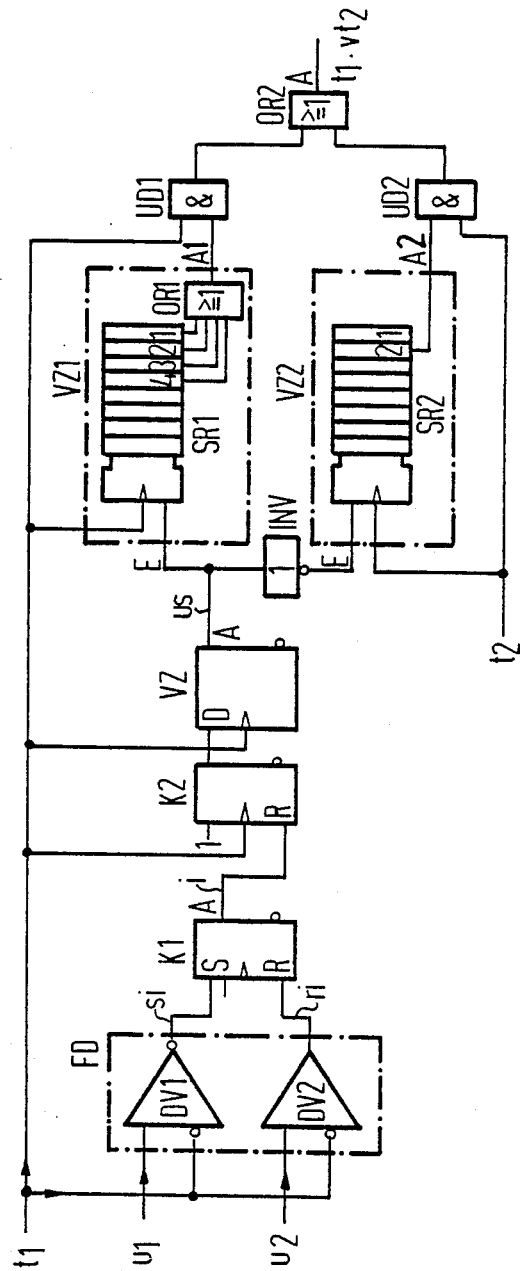

METHOD AND APPARATUS FOR ESTABLISHING A SYSTEM CLOCK IN RESPONSE TO THE LEVEL OF ONE OF TWO CLOCK SIGNAL SOURCES

BACKGROUND OF THE INVENTION

The invention is directed to a method for supplying a line with system clock signals which are formed either from clock signals over a first line exhibiting level fluctuations or are formed from digital clock pulses transmitted over a second line, in response to the level of the clock signals transmitted on the first line.

Methods are known in communications technology by which a clock is regenerated from a serial bit stream, this clock being utilized as a processing bit clock in communications-oriented equipment. In order to guarantee supplying the equipment with a bit clock in the absence of the in-coming bit stream, a switch is made to a bit clock generated internally in the equipment, using re-routing methods suitable for this purpose.

In the case of extremely high bit stream rates, for example such as in local or public ring networks, clock recovery methods based on surface wave filter technology are among those utilized. Such a clock regenerator equipped with surface wave filters, for data stream rates from 50 through 200M bits per second, is known from the Siemens publication, "LWL-Komponenten, Wandler, Senderund Empfaenger Messzubehoer", pages 92–93. The incoming data signals are first differentiated and rectified and supplied to a surface wave filter. Subsequently, the filtered output signal is again amplified and is available at an output as a regenerated clock. When, however, the incoming data bit stream comprises phase shifts, which frequently occur in ring networks because of the connection and disconnection of stations, then this leads to a significant lowering of the level of the clock signals present at the output and, when they fall below minimum voltage levels prescribed for defined circuit technologies, considerable disturbances result and undefined states in the system components can exist, for example, in the access controller of a ring network.

SUMMARY OF THE INVENTION

The principal object of the invention is to bridge the level fluctuations of the clock output signals due to switching over or switching back to a processing clock generated in the communications-oriented equipment, and of avoiding disturbances in the processing clock signal during the rerouting events.

Using a surface wave filter as described above, this object is achieved by a process of using two different delay intervals, and discriminating between upward and downward transgressions of two threshhold levels.

The advantage obtainable with the invention is that a downward transgression or, respectively, an upward transgression of the two threshold levels can be very quickly identified because of the check of every individual clock signal with respect to the level height, and a switch can be subsequently made to the other clock signals. Further, matching to a clock signal having fluctuations, in level or in occurrence times, can be accomplished by simply varying the level thresholds or, respectively, the delay times. Further, the resulting pulse stream offers well defined pauses between clock pulses without shortening nor lengthening the normal clock pulse width.

The objects of the invention are accomplished by using first and second trigger circuits, and logic elements connected thereto.

According to an advantageous improvement of the invention, the output signals of the second trigger circuit can be delayed in clock signal steps. The output signal of the second trigger circuit can, for example, be delayed by n* clock pulse lengths, where n is established by the plurality of clocked delay elements in the delay means. This assists in achieving a matching to the rate of change of the level of successive clock pulses, such as, for example, a slow sinking of the level of the clock signals recovered by means of the surface wave filter.

An advantageous circuit for realizing the method of the invention employs a delay line and AND and OR logic elements. A significant advantage of this circuit arrangement is that all system components can be realized with digital circuit technology and, thus, are suitable for an integration in a programmable logic array or a customer-tailored gate array.

Within the framework of an advantageous improvement of the arrangement, a first delay means can be realized with a shift register and with an OR logic element connected to defined shift register outputs. With this arrangement, a signal with variable delay time is generated, in response to the change of the binary information at the output of the second trigger circuit, in order to guarantee that the clock signal currently produced at the output of the apparatus is inhibited before a switch is made to the other respective clock signal.

BRIEF DESCRIPTION OF THE DRAWING

An exemplary embodiment of the invention shall be set forth in greater detail below with reference to a block functional diagram, which illustrates an illustrative embodiment of the invention.

DESCRIPTION OF THE PREFERRED EMBODIMENT

The block circuit diagram shows those system components necessary for explaining the present invention in a clock switching means which may be utilized for, for example, equipment which serves the purpose of access to a high speed ring network. The transmission medium can be, for example, light waveguides or make use of light waveguide transmitter-receiver technology. The clock recovery takes place in response to operation of a clock regenerator module (not shown) using surface wave filters, the clock signals t1 being present at the output of this clock regenerator module.

Given phase shifts occuring in the data bit stream or given missing data signals, the amplitudes of the regenerated clock signals t1 do not drop immediately but drop with a defined time constant. The clock signals t1 coming from the clock regenerator are respectively supplied to the inverting input of a first differential amplifier DV1 and to the inverting input of a second differential amplifier DV2. The second input of the first differential amplifier DV1 is connected to a voltage source U1 which represents an upper level threshold matched to the clock signal t1, and the second input of the second differential amplifier DV2 is connected to a second voltage source U2, which represents a lower level threshold matched to the clock signals t1. Both voltage sources U1 and U2 can be realized with electronic stabilization circuits, such as, for example, Zener diodes and variable voltage dividers. The level thresholds U1,U2 are to be matched to the maximum level fluctuations caused by the phase shifts and to the absolute level ratios of the clock signals t1.

The inverting output of the first differential amplifier DV1 is connected to the set input S, and the output of the second differential amplifier DV2 is conducted to the reset input R, of a first RS flip-flop or trigger circuit K1. The output of this first trigger circuit K1 is connected to the reset input R of a second RS flip-flop or trigger circuit K2. The output of this second trigger circuit K2 is connected to a delay stage VZ clocked by the clock signal t1. The delay means VZ can, for example, be realized by two further trigger circuits (not shown). The output of this delay means VZ is connected, first, to an input of a first delay means VZ1 and, second, to an input of a second delay means VZ2 via an inverter INV. The delay means VZ2, for example, is formed with an eight-stage shift register SR2. A delay time, adapted to the rate of change of the level of the clock signal t1, is determined by selecting one of the eight outputs of the shift register SR2, whereby this selected output produces the output at terminal AA of the second delay means VZ2. The first delay means VZ1 is likewise realized with an eight-stage shift register SR1; however, four of the eight outputs of the shift register SR1 are connected to inputs of a first OR logic element OR1 and the output of this first OR logic element OR1 produces the output at terminal A1 of the first delay means VZ1.

What is achieved with this arrangement is that two different delay times are formed in response to the direction of the change of the binary information "us" at the input E of the first delay means VZ1. The outputs of the two delay means VZ1, VZ2 are connected to first and second AND logic elements UD1, UD2. The outputs of the two AND logic elements UD1, UD2 are connected to the two inputs of a second OR logic element OR2, and the output of this second OR logic element OR2 represents the output of the clock switching means, at which the system clock is available. The clock signals t1 manifesting the level fluctuations are also conducted via corresponding connections to the clock input of the second trigger circuit K2, the clock input of the delay means VZ, and the clock input of the first delay means VZ1, and are also conducted to the second input of the first AND logic element UD1. A further digital internal clock signal t2 is connected to the clock input of the second delay VZ2 and to the second input of the second AND logic element UD2.

A window discriminator FD is formed by the two differential amplifiers DV1, DV2. When the clock signal t1 coming from the clock regenerator has an adequate level, then a short setting pulse "si" is formed and the trigger circuit K1 is set, when the upper level threshold u1 is exceeded, and a short reset pulse "ri" is formed to reset the trigger circuit K1 in response to downward transgression of the lower level threshold "u2". These two switching events are necessary in order to lengthen a potentially excessively short time during which the upper threshold "u1" is exceeded, by inserting a delay or a hysteresis until the lower threshold "u2" is downwardly transgressed by the clock signal. With the pulses generated by the setting or, resetting of the first trigger circuit K1, the second trigger circuit K2 is cyclically set or reset as long as the clock signals t1 coming from the clock regenerating means exhibit an adequately high level.

When the amplitude of the clock signal t1 no longer exceeds the upper level threshold, then no setting pulse "si" is formed and, thus, no pulse "i" is formed at the output of the trigger circuit K1 and, thus, the resetting of the second trigger circuit K2 is prevented. After a maximum of one clock pulse length, a change from, for example, the logical "0" status to the logical "1" status occurs at the output A of the trigger circuit K1. The following delay means VZ delays this binary information change, before it is conducted to the output thereof, by two clock periods. This information change represents the actual switch-over signal "us", which proceeds via the inverter INV and via the delay means VZ2 having a defined delay, to the second AND logic element UD2. At the same time, this switch-over signal "us" is conducted to the first delay means VZ1 and is forwarded to the first AND logic element UD1 with a defined delay time that is shorter than the delay time defined in the second delay means VZ2. The binary information change at the input of the first AND logic element UD1 effects an immediate inhibition of the output of the first AND logic element UD1, so that the clock signals t1 arriving from the clock generator are suppressed. After a time corresponding to the difference between the two delay times, the switchover signal "us" reaches the input of the second AND logic element UD2 and enables the output of this second logic element, whereby the internally generated clock signals t2 are forwarded to the output of the AND logic element UD2. What is assured by the simultaneous inhibition of the outputs of both AND logic elements UD1, UD2, during the time corresponding to the difference between the two delay times, is that no overlaying of the clock pulses t1, t2 occurs and, thus, no clock signals t1 and t2, which would disturb the clocked equipment, proceed via the inputs of the second OR logic element OR2 to the output thereof. It is thereby guaranteed that the respective clock signals t1 and t2 are connected and disconnected in synchronization via the AND logic elements UD1, UD2.

When the amplitude of the clock signals t1 supplied from the clock recovery means again exceeds the upper level threshold, then pulses "i" are again present at the output of the first trigger circuit K1, leading to a binary information change "us" at the output of the delay means VZ, after a delay of two clock steps. This produces the results first, that the internally generated clock signals t2 no longer proceed to the output of the second OR logic element OR2, after a delay time defined in the second delay means VZ2 with the second AND logic element UD2 and, second, that the regenerated clock signals t1 proceed to the output A of the second OR logic element OR2 through UD1 after a delay time in the first delay means VZ1 which is longer than that of the second delay means VZ2.

All system components of the clock switching means can be realized, for example, with integrated ECL circuits of the fast 100K technology marketed commercially by Fairchild. By way of example, commercially available IC's are listed below for the individual system components.

| | |
|---|---|
| Differential Amplifiers DV1,DV2 | F 100 114 |
| Trigger Circuits K1, K2 | F 100 131 |
| Delay Means VZ (register) | F 100 151 |

| | |
|---|---|
| -continued | |
| Delay Means VZ1, VZ2 (8-stage shift register) | F 100 141 |
| AND Logic Element UD | F 100 102 |
| OR Logic Element OR | F 100 101 |

It will be apparent that various modifications and/or additions may be made in the apparatus of the invention without departing from the essential feature of novelty involved, which are intended to be defined and secured by the appended claims.

I claim:

1. A method for supplying a line with system clock signals which are formed either form first clock signals over a first line (t1) having level fluctuations or are formed from digital block pulses transmitted via a second line (t2), in response to the level of the clock signals transmitted on the first line, comprising the steps of:

comparing each of said first clock signals (t1) with a lower and with an upper level threshold (u1,u2) and, in the case of transgression of the upper level threshold (u1), forming a setting signal (si) and, given downward transgression of the lower level threshold (u2), forming a reset signal (ri);

forwarding said setting signal and said reset signal to the set and reset inputs (S,R) of a first trigger circuit;

conducting an output signal (i) formed by the first trigger circuit (K1) to a reset input (R) of a second trigger circuit (K2) clocked by a clock signal (tI) on said first line;

in the case of a downward transgression of the lower level threshold (u2) occurring following an upward transgression of the upper level threshold (u1), conducting an information change signal (us) from an output of the second trigger circuit (k2) to an input of a first logic element (UD1) with a prescribed, first time delay period, to suppress forwarding of the clock signals (Tl) to a line with the system clock and, simultaneously, delaying the output signals of the second trigger circuit (K2) by a second time period longer than the first time period and supplying them to a first input of a second logic element (UD2) to conduct the clock pulses (t2) from said second line to an output of the second logic element (UD2);

and in the case of a downward transgression of the upper level threshold (uI) occurring following a preceding upward transgression thereof, conducting the information change (us) to said second logic element (UD2) delayed with said first time period, whereby the output of said second logic element (UD2) is inhibited; and simultaneously delaying the information change (us) by a third time period which is shorter than the first time period and supplying the information change signal (us) to said first logic element (UD1), whereby the clock signals (t1) are forwarded to an output of the first logic element (UD1); and conducting the clock signals (t1) or the clock pulses (t2) to different inputs of a logic element (OR2) whereby either the clock signals (t1) or the clock pulses (t2) are manifested as system clock pulses at an output thereof.

2. The method according to claim 1, including the step of delaying the output signals of said second trigger circuit in steps corresponding to multiple of a period of said clock signal.

3. Apparatus for selecting system clock pulses from first clock pulses on a first line having level fluctuations, or second clock pulses from a internal clock pulse source on a second line comprising, in combination;

two differential amplifiers (DV1,DV2) forming a window discriminator each having one of their inputs connected to said first line and their other input connected to a voltage potential representing an upper level threshold (u1) or, respectively, a lower level threshold (U2), a first trigger circuit (K1) and means connecting outputs of the differential amplifiers (DV1,DV2) respectively to reset and set inputs (R,S) of said first trigger circuit (K1), a second trigger circuit (K2) and means for connecting an output of said first trigger circuit to a reset input (R) of said second trigger circuit (K2), first and second delay means means for connecting an output of said second trigger circuit (K2) to the input (E) of said first delay means (VZ1) and to an input (E) of said second delay means (VZ2);

first and second AND logic elements and means for connecting outputs (A) of said first and said second delay means (VZ1,VZ2) to respective first inputs of said first and second AND logic elements (UD1,UD2), an OR logic element (OR2) and means for connecting the outputs of said AND logic elements to respective inputs of said OR logic element (OR2) whereby the first clock pulses (t1) or the second clock pulses (t2) are produced as a system clock at the output of said OR logic element, means connecting the first line carrying said first pulses (t1) to a clock input of the second trigger circuit (K2) and to a clock input of the first delay means (VZ1) and to a second input of the first AND logic element (UD1) and means connecting the second line carrying said second clock pulses (t2) to a clock input of the second delay element (VZ2) and to a second input of the second AND logic element (UD2).

4. The arrangement according to claim 3, wherein said second delay means (VZ2) comprises a shift register (SR2) and means for selecting a shift register output representing a delayed output.

5. The arrangement according to claim 3, wherein said first delay means (VZ1) comprises a shift register (SR1) and means for connecting at least three of the shift register outputs of said first delay means to an OR logic element (OR1), whereby an output of the OR logic element (OR1) represents the delayed output of the first delay means (VZ1).

* * * * *